May 22, 1962 S. L. BROADHEAD, JR., ET AL 3,036,211
NOISE CONTROLLED VARIABLE A.V.C. DELAY CIRCUIT
Filed May 5, 1960
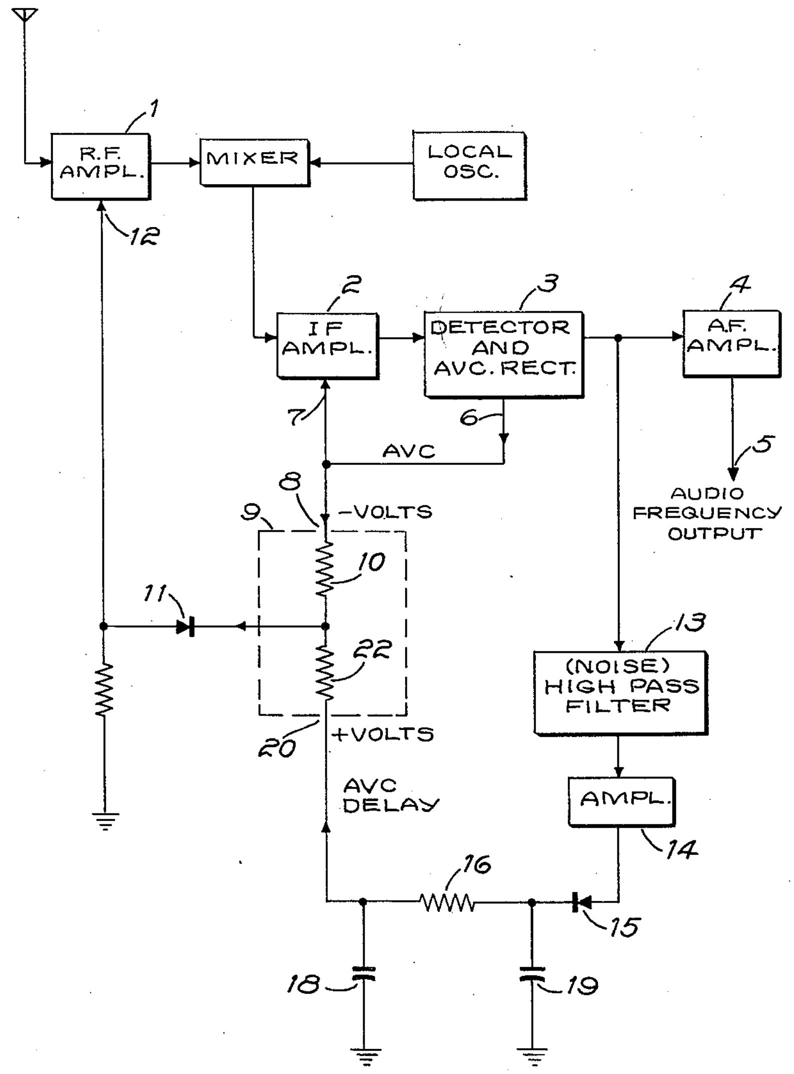
INVENTORS
SAMUEL L. BROADHEAD, JR.
HARLAN G. MICHAEL
BY
Moody and Antrim
AGENTS United States Patent Office 3,036,211
Patented May 22, 1962

3,036,211

NOISE CONTROLLED VARIABLE A.V.C. DELAY CIRCUIT

Samuel L. Broadhead, Jr., and Harlan G. Michael, Cedar Rapids, Iowa, assignors to Collins Radio Company, Cedar Rapids, Iowa, a corporation of Iowa Filed May 5, 1960, Ser. No. 27,068
1 Claim. (Cl. 250—20)

This invention pertains to delayed automatic-volume-controls (A.V.C.) of radio receivers and particularly to A.V.C. circuits having means for modifying the distribution of control voltages according to the strength of the signals which are being received.

Commonly, bias voltages are applied to A.V.C. circuits to prevent, or delay, their operation until an incoming signal which is applied to the inputs of the receivers exceeds a predetermined threshold level. When the level of the incoming signal is less than the threshold level, the controlled radio-frequency amplifier stages of the receivers operate at or near maximum gain. When the delay voltage circuit of this invention is used in a receiver, the gain of the first stages to which an incoming signal is being applied is delayed a variable amount dependent upon the noise level at the succeeding detector. The variable delay of the A.V.C. in the first stages provides an improved signal-to-noise ratio for weak signals. More particularly, while the level of an incoming signal is above that which requires maximum gain of the radio-frequency stages but below that level which reduces gain sufficiently to eliminate the noise that is generated in the receiver circuit, the gain of the first stages are proportionally greater than the gain of the succeeding stages. However, when a signal of high level is applied, a greater proportion of the A.V.C. voltage is applied to the first stages in order to reduce the gain to that extent required for preventing overloading of succeeding stages.

Fixed delay means such as those using diodes and biasing circuits are impractical for the first stages in receiving circuits in which little tolerance in output volume is allowable. Different amounts of delay would be required in different receivers because of differences in gain of new receivers and changes in gain of individual receivers caused by aging of component parts.

This invention for providing a variable delay voltage in a A.V.C. circuit comprises a voltage combining circuit that has its output connected to the gain-control circuits of the first stages of a radio receiver, and a conventional A.V.C. circuit and a novel noise controlled delay voltage circuit connected to the inputs of said combining circuit, the outputs of the A.V.C. and delay voltage circuits being added in opposition in the combining circuit for application to the gain-control circuits of said first stages.

An object of this invention is to obtain in radio receivers maximum signal-to-noise ratio by providing variable delay voltages to the A.V.C. circuits of the first radio-frequency amplifier stages of the radio receivers.

Another object is to remove the delay voltage automatically in the absence of noise in the detector circuit of the receiver in order to prevent overloading of the amplifier circuits of the receivers.

The following description and the appended claim may be more readily understood with reference to the single figure of the accompanying drawing. A delay circuit according to this invention is shown in block diagram and schematic form, connected to a conventional radio receiver that is represented in block form.

The radio receiver shown as an example in the accompanying drawing is a conventional superheterodyne receiver that includes a radio-frequency amplifier 1 and a succeeding intermediate-frequency amplifier 2 for amplifying incoming signal and applying it to the combined detector and A.V.C. rectifier 3. The detector applies audio-frequency signal, for example voice signal with frequencies below 5,000 cycles per second, to a conventional audio-frequency amplifier 4 which has an audio-frequency output circuit 5.

The output 6 of a conventional A.V.C. circuit is applied to gain control circuit 7 of the intermediate-frequency amplifier 2 and also to the terminal 8 of summing circuit 9. When the receiver is receiving strong signals, substantially the full voltage from A.V.C. output circuit 6 is applied through resistor 10 and rectifier 11 to the gain control circuit 12 of the first radio-frequency amplifier 1.

An A.V.C. delay circuit is connected to the audio-frequency output circuit of detector 3. The voltage developed by the delay circuit during reception of weak signals causes the A.V.C. to be less effective in reducing gain in the radio-frequency amplifier 1 than in the succeeding amplifier 2. The input of high-pass filter 13 of the delay voltage circuit is connected to the output of detector 3 for passing noise which has frequencies higher than the frequencies within that range which contains most of the power for the audio-frequency output circuit 5. The signal that is passed through the filter during reception of weak signals is oftentimes substantially all derived from circuit noise which is generated within the first radio-frequency stages of the receiver. The noise output of the filter is connected through amplifier 14 to diode rectifier 15. The noise signal is thereby amplified and rectified for developing substantial direct-current control voltage which is opposite in polarity to that derived from the output circuit 6 of the detector and A.V.C. rectifier 3. The delay voltage is applied through a usual filter comprising resistor 16 and capacitors 18 and 19 to terminal 20 of summing circuit 9. This control voltage which is developed from the noise signal during reception of weak incoming signal is applied through resistor 22 of the summing circuit 9 to be combined in opposition to the A.V.C. voltage that is applied through resistor 10 to the output of the summing circuit.

When the output of the detector contains considerable noise, the delay voltage may substantially cancel the A.V.C. voltage that is to be applied from the output of summing circuit 9 to the gain-control circuit 12 of radio-frequency amplifier 1. When the noise level at the output of detector 3 is high, the delay voltage may become high enough to reverse the control voltage existing at the output of the summing circuit. The diode rectifier 11 is included between the output of summing circuit 9 and the gain control circuits 12 in order to prevent a reversal of the bias control voltage which is applied to radio-frequency amplifier 1. The time constant of the filter that comprises resistor 16 and capacitors 18 and 19 in the output of the delay circuit is not critical but would ordinarily correspond to the usual time constant of the A.V.C. circuit.

When no signal is being received, the relatively low bias voltage from output 6 of the conventional A.V.C. circuit is applied to both the radio-frequency amplifier 1 and the succeeding intermediate-frequency amplifier 2. While the bias is low, the amplifiers operate at maximum gain and produce maximum noise for application through high-pass filter 13 of the delay voltage circuit. Since the A.V.C. voltage is low, the delay voltage is insignificant in changing the gain of the radio-frequency amplifier. Should the delay voltage exceed the A.V.C. voltage, the diode 11 in the control line for the radio-frequency amplifier becomes nonconductive so that a fixed bias voltage for the amplifier is effective in maintaining the electron tube or transistor device in the state for maximum gain.

When a received signal is weak but has sufficient level to cause a reduction in gain, bias voltage for reducing gain is applied from the A.V.C. output circuit to intermediate-frequency amplifier 2 and to the summing circuit 9. While the voltage is effective in reducing the gain of the intermediate-frequency amplifier 2, the voltage applied to terminal 8 of the summing circuit is opposed by the delay voltage that is applied to its terminal 20. Therefore, with an incoming signal that is gradually increasing in strength, the gain of the amplifier 2 is reduced prior to the reduction in gain of the preceding amplifier 1. The decreasing gain of the second amplifier 2 gradually causes a reduction in noise for application to the delay voltage circuit, and finally at higher levels of input signal no delay voltage is developed. The application of substantially full A.V.C. voltage to the first amplifier during reception of strong signals prevents overloading of succeeding stages.

In the accompanying drawing the A.C.C. voltage is shown negative and the opposing delay voltage is shown positive according to the practice of applying biasing voltages to the control grids of electron tubes and to circuits using certain types of transistors. Obviously, those skilled in the art may change the wiring of the A.V.C. rectifying circuit 3 to supply positive A.V.C. voltage and may reverse diode rectifiers 11 and 15 as may be required for circuits using different types of transistors in the controlled stages of amplification.

What is claimed is:

In a radio receiver having in cascade first and second radio-frequency amplifiers and a detector, said first and second amplifiers having first and second biasing circuits respectively for controlling gain, said detector having an audio-frequency output and also an automatic-volume-control output for supplying automatic-volume-control voltage, said second biasing circuit being connected to said automatic-volume-control output; a delay voltage circuit comprising a high-pass noise filter, an amplifier, and a rectifying circuit connected in cascade, the input of said noise filter being connected to said audio-frequency output circuit for the application of high-frequency noise signal through said filter and through said amplifier to the input of said rectifying circuit, a resistive voltage divider having two end terminals and an intermediate terminal, one of said end terminals being connected to the output of said rectifying circuit, the other one of said end terminals being connected to said automatic-volume-control output, a diode rectifier, said intermediate terminal being connected through said diode rectifier to said first gain control circuit, said rectifying circuit being adapted for developing delay voltage in response to application of noise signal, said delay voltage circuit being adapted for providing delay voltage having polarity opposite to that of said automatic-volume-control voltage, and said diode rectifier being connected in that sense required for applying to said first biasing circuit voltage having the polarity of said automatic-volume-control voltage.

References Cited in the file of this patent

UNITED STATES PATENTS

| | | |
|---|---|---|
| 2,022,478 | Peterson | Nov. 26, 1935 |
| 2,853,601 | McKenna et al. | Sept. 23, 1958 |
| 2,857,594 | Frank et al. | Oct. 21, 1958 |